United States Patent
Mori

(10) Patent No.: US 8,767,382 B2
(45) Date of Patent: Jul. 1, 2014

(54) SERVER RACK AND POWER FEEDING METHOD THEREIN

(75) Inventor: Katsutoshi Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 328 days.

(21) Appl. No.: 13/085,651

(22) Filed: Apr. 13, 2011

(65) Prior Publication Data

US 2011/0255230 A1 Oct. 20, 2011

(30) Foreign Application Priority Data

Apr. 20, 2010 (JP) ................................ 2010-096886

(51) Int. Cl.
*H05K 5/00* (2006.01)

(52) U.S. Cl.
USPC ... 361/679.02; 312/128; 312/130; 312/223.2; 312/260; 312/408; 211/22; 211/24; 211/26; 211/49.1

(58) Field of Classification Search
USPC ............... 361/679.01, 679.27, 752–756, 814, 361/679.02, 724; 455/574; 211/22, 24, 26, 211/49.1; 312/128, 130, 223.2, 260, 408
See application file for complete search history.

(56) References Cited

U.S. PATENT DOCUMENTS

| | | | |
|---|---|---|---|
| 6,310,783 B1 * | 10/2001 | Winch et al. ................. | 361/797 |
| 7,358,439 B2 * | 4/2008 | Rasmussen et al. ............ | 174/50 |
| 7,730,332 B1 * | 6/2010 | Templeton .................... | 713/300 |
| 7,982,145 B2 * | 7/2011 | Yuba et al. ................... | 200/51 R |
| 2009/0319713 A1 * | 12/2009 | Leung .......................... | 710/302 |
| 2010/0208463 A1 * | 8/2010 | Chen et al. .................... | 362/260 |
| 2011/0018342 A1 * | 1/2011 | Park et al. ..................... | 307/23 |

FOREIGN PATENT DOCUMENTS

| | | |
|---|---|---|
| JP | 10-224915 A | 8/1998 |
| JP | 2004-178214 A | 6/2004 |
| JP | 2005-509387 A | 4/2005 |
| JP | 2008-193876 A | 8/2008 |

OTHER PUBLICATIONS

Japanese Office Action for JP Application No. 2010-096886 mailed on Oct. 29, 2013 with English Translation.
Japanese Office Action for JP Application No. 2010-096886 mailed on Jan. 21, 2014 with English Translation.

* cited by examiner

*Primary Examiner* — Robert J Hoffberg
*Assistant Examiner* — Hung Dang
(74) *Attorney, Agent, or Firm* — Sughrue Mion, PLLC

(57) ABSTRACT

A server rack according to the present invention mounts a plurality of servers. The server rack includes a plurality of central power supply units, each of which arranged between the plurality of servers with regular intervals, each of the plurality of central power supply units supplying electric power to one or more of the servers; and a direct-current power supply cable that connects the server and the central power supply unit. The direct-current power supply cable connects each of the servers and the central power supply units within a range of a predetermined distance.

9 Claims, 4 Drawing Sheets

SERVER RACK AND POWER FEEDING METHOD THEREIN

INCORPORATION BY REFERENCE

This application is based upon and claims the benefit of priority from Japanese patent application No. 2010-096886, filed on Apr. 20, 2010, the disclosure of which is incorporated herein in its entirety by reference.

BACKGROUND OF THE INVENTION

1. Technical Field

The present invention relates to a server rack and as power feeding method in the server rack, and more particularly, to a server rack including a plurality of power supply units as one power supply unit and a power feeding method in the server rack.

2. Background Art

In recent years, data center business has been developed to lend servers integrated in one place to a user. However, in existing data centers, the power that can be supplied to one rack is limited.

Typically, a rack that mounts servers mounts a power supply unit for each server basis. However, it is not always that high load is constantly applied to the servers mounted on the rack, and the servers do not necessarily make the most of the power supply capacity of the power supply unit constantly.

A technique of managing a plurality of power supply units as one power supply unit and supplying electric power to a plurality of servers from the power supply unit is disclosed in Japanese Unexamined Patent Application Publication No. H10-224915 (Fujiwara). In the technique disclosed by Fujiwara, electric power is supplied to a plurality of servers from a power supply unit arranged in the center of a rack through a bas bar made of copper. Employing, a has bar makes it possible to prevent high impedance in a power feed path.

However, the present inventors have found a problem that, in the technique of Fujiwara, since the bas bar is used to send direct current between the power supply unit and servers, it requires a dedicated rack or equipment corresponding to the has bar. Further, since the has bar is used, the position in which the power supply unit and the servers can be arranged is determined in advance.

SUMMARY

The present invention has been made in order to solve such problems, and aims to provide a server rack and a power feeding method in a server rack that can be provided more easily while suppressing the power loss.

An exemplary aspect of the present invention is a server rack including a plurality of central power supply units, each of which arranged between the plurality of servers with regular intervals, each of the plurality of central power supply units supplying electric power to one or more of the servers; and a direct-current power supply cable that connects the server and the central power supply unit, wherein the direct-current power supply cable connects each of the servers and the central power supply units within a range of a predetermined distance.

According to the present invention, it is possible to provide a server rack and a power feeding method in a server rack that can be provided more easily while suppressing the power loss.

The above and other objects, features and advantages of the present invention will become more fully understood from the detailed description given hereinbelow and the accompanying drawings which are given by way of illustration only, and thus are not to be considered as limiting the present invention.

Exemplary Embodiment

First Exemplary Embodiment

Figure 1:
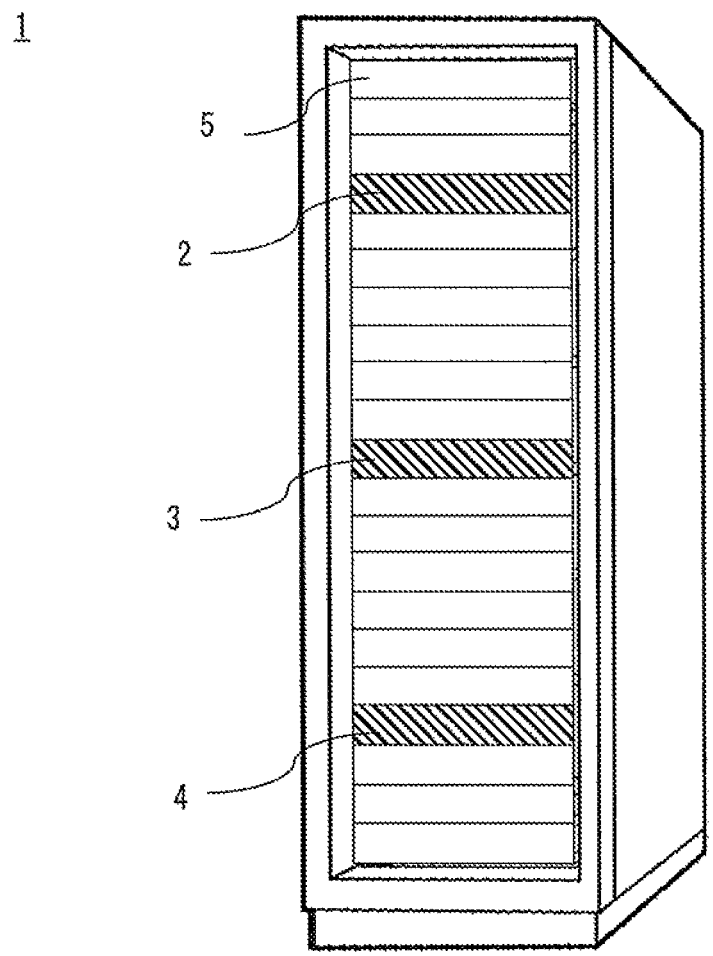
FIG. 1 is a diagram showing a server rack 1 according to a first exemplary embodiment of the present invention.

Hereinafter, an exemplary embodiment of the present invention will be described with reference to the accompanying drawings. For the purpose of clarification, the following description and the drawings are omitted and simplified as appropriate. Each element shown in the drawings as functional blocks executing various processing can be configured by a CPU (Central Processing Unit), a memory, or another circuit in hardware, and can be implemented by programs loaded to a memory in software. Accordingly, a person skilled in the art will understand that these functional blocks may be realized in various ways by only hardware, only software, or a combination thereof, and the functional blocks are not limited to one. Further, the configuration of each device shown in the accompanying drawings is realized by executing a program that is read into a storage device, for example, on a computer (PC (personal computer), portable terminal device or the like). Further, these programs can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via, a wired communication line (e.g. electric wires, and optical fibers) or a wireless communication line.

FIG. 1 is a diagram showing a server rack 1 according to a first exemplary embodiment of the present invention. The server rack 1 according to the first exemplary embodiment includes a plurality of servers 5, a plurality of central power supply units 2 to 4, and direct-current power supply cables connecting the plurality of servers 5 and the central power supply unit 2 (see FIG. 2).

Each of the central power supply units 2 to 4 are arranged between the plurality of servers 5 with predetermined intervals, and supply electric power to one or more servers 5. The direct-current power supply cables connect each server 5 and the central power supply unit 2 within a range of a predetermined distance.

Figure 2:
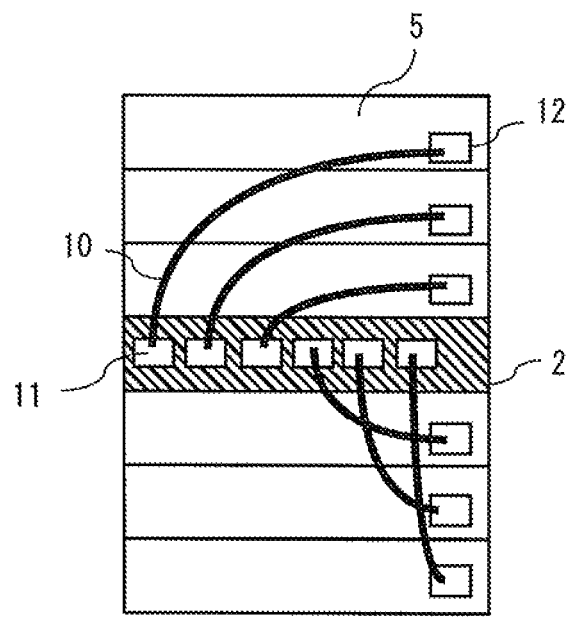
FIG. 2 shows a server 5 and a central power supply unit 2 according to the first exemplary embodiment of the present invention.

FIG. 2 shows the server 5 and the central power supply unit 2. The central power supply unit 2 and the server 5 include connectors 11 and 12, respectively. The connectors 11 of the central power supply unit 2 and the connectors 12 of the servers 5 are connected through the direct-current power supply cables 10.

In the first exemplary embodiment, each of the central power supply units is arranged between the plurality of servers with predetermined intervals. Accordingly, it is possible to connect the central power supply unit and servers by the direct-current power supply cables without making the lengths of the cables larger than necessary. Accordingly, it is possible to provide a server rack which is capable of minimizing power loss that is caused due to the use of the direct-current power supply cable 10 and is easily arranged with reduced power loss.

The server rack 1 according to the first, exemplary embodiment will be described further in detail. It is desirable that the voltage of the electric power supplied from the central power supply unit 2 to the server 5 is 12 V or less. A typical technique for transmitting DC requires a dedicated equipment called "bus bar" as a power transmission path. However, the first exemplary embodiment uses DC with low voltage. Thus, it is possible to use a DC cable with ensured safety which is generally available. Specifically, a copper line cable such as an AWG (American wire gauge) which can be easily handled can be used as the DC cable.

Figure 3:
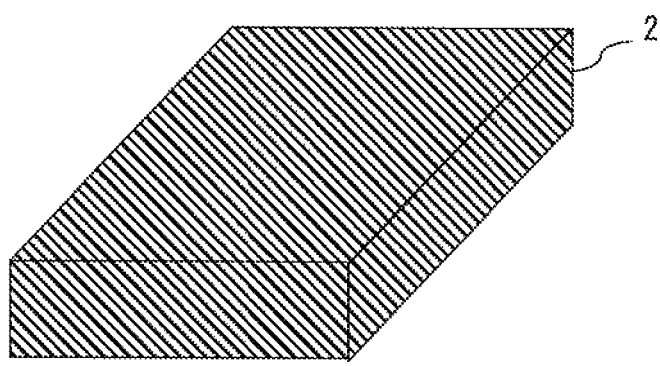
FIG. 3 is a diagram showing the central power supply unit 2 according to the first exemplary embodiment of the present invention.

FIG. 3 is a diagram showing, the central power supply unit 2 according to the first exemplary embodiment of the present invention. The central power supply unit 2 includes a plurality of power supply units 13 therein, and supplies the electric power to the plurality of servers 5.

Figure 4:
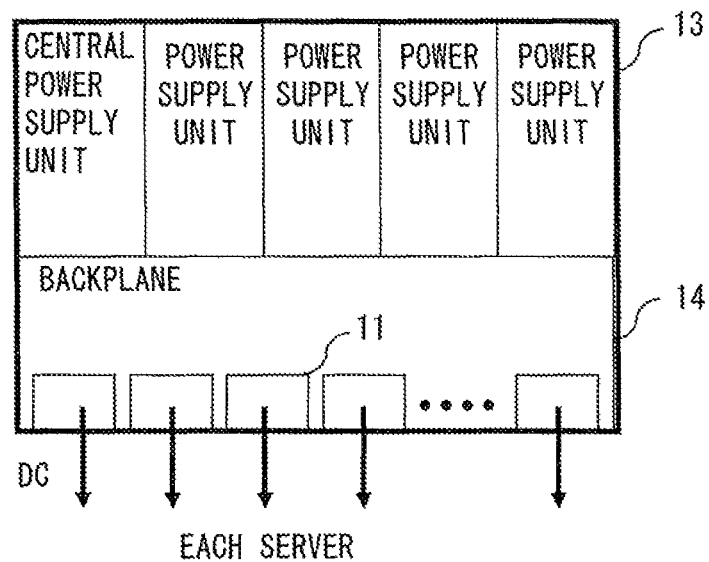
FIG. 4 is a diagram showing an interior of the central power supply unit 2 according to the first exemplary embodiment of the present invention.

FIG. 4 is a diagram showing an interior of the central power supply unit 2. The central power supply unit 2 includes a plurality of power supply units 13, and a backplane 14 that mutually connects the plurality of power supply units 13.

The backplane 14 includes a plurality of connectors 11 to output DC (direct current). The plurality of power supply units 13 are assembled by the backplane 14, and are connected to the plurality of power supply connectors 11 that output DC. In the first exemplary embodiment, the power supply connectors 11 are mounted on the rear surface of the case.

The central power supply unit 2 includes the plurality of power supply units 13, through which large electric power supplied to the plurality of servers 5 is supplied. Further, the central power supply management unit 2 only turns on as part of the power supply units 13 and makes the other power supply units 13 idle when the power consumption of the server 5 that is connected thereto is small, thereby suppressing power consumption.

The central power supply unit 2 supplies the electric power to the server 5 through the connector 11 and the direct-current power supply cable 10.

Figure 5:
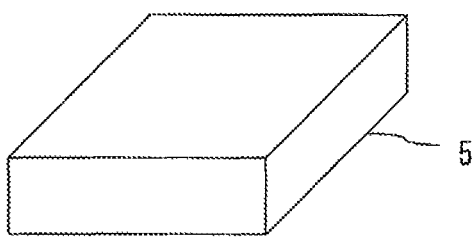
FIG. 5 is a diagram showing the server 5 according to the first exemplary embodiment of the present invention.
Figure 6:
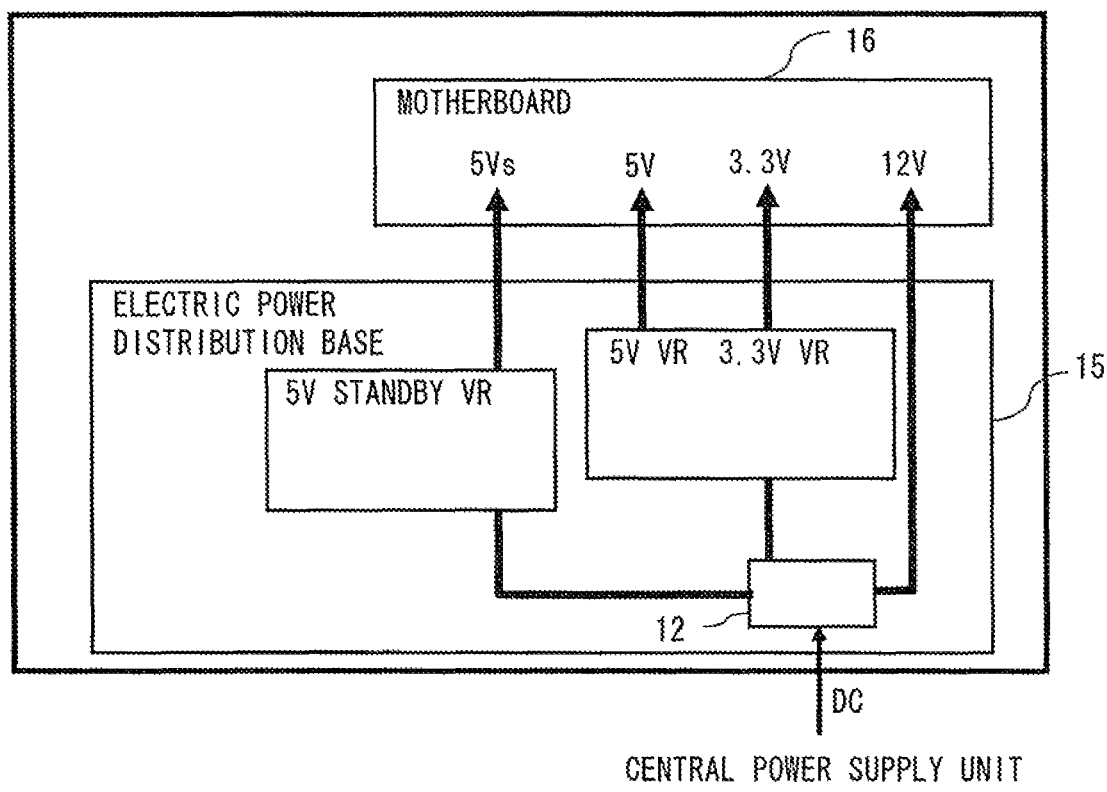
FIG. 6 is a diagram showing an interior of the server 5 according to the first exemplary embodiment of the present invention.

Next, the server 5 will be described. FIG. 5 is a diagram showing the server 5. FIG. 6 is a diagram showing an interior of the server 5. The server 5 includes a connector 12, an electric power distribution base 15, and a motherboard 16.

The connector 12 is mounted on the rear surface of the case, and can provide a hop swap system.

The electric power distribution base 15 divides the electric power supplied from the central power supply unit 2 into a plurality of different voltages. Further, when there is no need to divide the electric, power, the electric power supplied from the central power supply unit 2 to the server 5 is directly supplied to the motherboard 16 of the server 5.

The electric power distribution base 15 includes VRs (Voltage Regulators) that distribute the electric power supplied through the connector 12 to voltages of 5 V standby (5 Vs), 3.3 V, 5 V, and 12 V.

The server rack 1 does not include the power supply units 13 but includes the electric power distribution base 15, which makes it possible to input DC directly into the server 5. Since the server 5 does not include the power supply units 13 but includes the electric power distribution base 15, there is a free space and the size of the server 5 can be reduced.

Now, the direct-current power supply cable 10 will further be described. In a copper line DC cable, voltage loss of about 50 mV occurs with the cable length of 50 cm.

When the voltage used in the motherboard 16 is 12 V, the allowable reduced value is about 240 mV, considering that the allowable value of the deviation of the voltage is about ±2%. Accordingly, in the first exemplary embodiment, the cable length is preferably 240 cm or less. Further, similarly, when the voltage used in the motherboard 16 is 5 V or 3.3 V and the cable is connected with the voltage of 3.3 V or 5.5 V, the allowable amount of the deviation of the voltage is 100 mV and 66 mV, respectively, and it is preferable that the length of the direct-current power supply cable 10 is 100 cm or less and 66 cm or less, respectively. From the above description, the length of the direct-current power supply cable 10 is preferably 240 cm or less, and more preferably, 60 to 80 cm, considering the voltage of 3.3 V.

In the related art, a bus-bar is typically used when the direct-current power supply is used for supplying electric power. Since the power feed path is fixed when the bus bar is arranged, it is impossible to connect the power supply unit 13 and the server 5 with minimum distance, and the path may become longer than required. The increase in the length of the power feed path decreases the voltage of the electric power to be supplied. Accordingly, the voltage of the electric power to be supplied is required to be 12 V or more in order to suppress the decrease in the voltage of the power to be supplied.

In the first exemplary embodiment, the central power supply unit 2 is arranged to be sandwiched between the plurality of servers 5, and the central power supply unit 2 and the server 5 are connected by the direct-current power supply cable 10 with shorter length. Since the connection with reduced complexity and connection with as minimized distance can be achieved by the cable compared with the bus bar which has been used to supply the direct current in the related art, it is possible to minimize the voltage decrease even when the power supply of 12 V is used.

Further, when the motherboard 16 is generally operated, the voltage of 12 V, 5 V, or 3.3 V is required. In some cases, the electric power with a voltage higher than 12 V is supplied to the server 5 from the central power supply unit 2. In such cases, this voltage needs to be converted to 12 V, 5 V, or 3.3 V. Since there is a large voltage difference between these voltages, large conversion loss is occurred.

Meanwhile, according to the first exemplary embodiment, a low voltage of 12 V is used. When a circuit requires the voltage of 12 V, the current is directly supplied. When a circuit requires the voltage of 5 V or 3.3 V, the voltage of 12 V is converted to the voltage of 5 V or 3.3 V. Hence, the loss for conversion can be reduced. Accordingly, it is possible to prevent high impedance in the power feed path due to the conversion.

In the first exemplary embodiment, the central power supply unit is connected between the servers 5, and the central power supply unit and the servers 5 are connected by DC cables so as to minimize the connection distance. Accordingly, there is no need to provide a bus bar, which enables the simpler arrangement by DC cables that can be laid with reduced complexity, thereby it is possible to reduce cost for introducing, this system and time for arrangement.

Further, by minimizing the complexity in laying the DC cable between the servers 5 and the central power supply unit, the power loss can be minimized. Further, this technique may also be used in other devices such as a blade server or a storage server in addition to a server rack.

Since the connection is performed by cables, a central power supply unit and a server that are mounted on different racks may be connected by a DC cable within a range of a predetermined distance as an application example. When DC is transmitted between the central power supply unit and the server 5, a stick-like "bus bar" is employed as a power transmission path in consideration of safety. Meanwhile, in the first exemplary embodiment, it is possible to use a general DC cable made of copper. Hence, there is no need to provide a dedicated rack or equipment to construct a bus bar, thereby it is possible to reduce the cost for construction and time for arrangement.

From the above description, by optimizing the arrangement of the power supply unit 13 and the server 5, it is possible to optimize power efficiency and reduce electric power consumption for each server 5. Further, by arranging the electric power distribution base, the size of the server 5 can be reduced. Furthermore, by reducing the size of the server 5 and suppressing power consumption, a larger number of servers 5 can be mounted in a data center room. Accordingly, it is possible to promote environmentally friendly green IT.

Note that the present invention is not limited to the above-described exemplary embodiment, but may be changed as appropriate without departing from the spirit of the present invention.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A server rack that mounts a plurality of servers, comprising:
a plurality of central power supply units, each of which arranged between the plurality of servers with regular intervals, each of the plurality of central power supply units supplying electric power to one or more of the servers; and
a direct-current power supply cable that connects the server and the central power supply unit,
wherein the direct-current power supply cable connects each of the servers and the central power supply units within a range of a predetermined distance,
wherein a voltage of the electric power supplied from the central power supply unit to the server is 12 V or less, and
the length of the direct-current power supply cable is 240 cm or less.

2. The server rack according to claim 1, wherein the electric power supplied from the central power supply unit to the server is supplied directly to a motherboard of the server.

3. The server rack according to claim 1, wherein the server comprises an electric power distribution base that divides the electric power supplied from the central power supply unit into a plurality of different voltages,
wherein the electric power supplied from the central power supply unit through the electric power distribution base is supplied to the motherboard of the server.

4. The server rack according to claim 1, wherein the length of the direct-current power supply cable is set so that a decrease of a voltage of the electric power that is supplied by using the direct-current power supply cable is within 2% of power to be supplied.

5. The server rack according to claim 4, wherein the length of the direct-current power supply cable is 240 cm or less.

6. The server rack according to claim 4, wherein the length of the direct-current power supply cable is 80 cm or less.

7. The server rack according to claim 1, wherein the length of the direct-current power supply cable is 80 cm or less.

8. A power feeding method in a server rack that mounts a plurality of servers, comprising:
arranging a plurality of central power supply units between the plurality of servers with regular intervals, each of the plurality of central power supply units supplying electric power to one or more of the servers; and
connecting the server and the central power supply unit by a direct-current power supply cable within a range of a predetermined distance,
wherein a voltage of the electric power supplied from the central power supply unit to the server is 12 V or less, and
the length of the direct-current power supply cable is 240 cm or less.

9. The power feeding method in the server rack according to claim 8, comprising directly supplying the electric power from the central power supply unit to a motherboard of the server.

* * * * *